United States Patent
Song et al.

(10) Patent No.: US 10,326,107 B2
(45) Date of Patent: Jun. 18, 2019

(54) FLEXIBLE DISPLAY DEVICE

(71) Applicant: LG Display Co., Ltd., Seoul (KR)

(72) Inventors: Hyunjoo Song, Seongnam-si (KR); Hyunju Jung, Seoul (KR); Jongju An, Goyang-si (KR); Dojin Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/807,918

(22) Filed: Nov. 9, 2017

(65) Prior Publication Data

US 2018/0151836 A1    May 31, 2018

(30) Foreign Application Priority Data

Nov. 30, 2016 (KR) .......................... 10-2016-016152

(51) Int. Cl.
*H01L 27/14* (2006.01)
*H01L 51/52* (2006.01)
*H01L 27/32* (2006.01)
*H01L 51/00* (2006.01)

(52) U.S. Cl.
CPC ........ *H01L 51/5253* (2013.01); *H01L 27/322* (2013.01); *H01L 27/3244* (2013.01); *H01L 51/0097* (2013.01); *H01L 51/524* (2013.01); *H01L 51/5246* (2013.01); *H01L 51/5259* (2013.01); *H01L 2251/5338* (2013.01); *Y02E 10/549* (2013.01)

(58) Field of Classification Search
CPC ............... H01L 27/322; H01L 27/3244; H01L 51/0097; H01L 51/524
USPC ............................................... 257/40, 59, 72
See application file for complete search history.

(56) References Cited

U.S. PATENT DOCUMENTS

| 6,822,391 | B2 * | 11/2004 | Yamazaki ........... H01L 51/5253 |
| | | | 313/500 |
| 9,236,418 | B2 * | 1/2016 | Yamazaki ........... H01L 27/3258 |
| 2003/0027369 | A1 | 2/2003 | Yamazaki |
| 2012/0139821 | A1 | 6/2012 | Kim et al. |
| 2015/0091012 | A1 | 4/2015 | Namkung et al. |
| 2016/0329520 | A1 | 11/2016 | Namkung et al. |

OTHER PUBLICATIONS

Extended European Search Report dated May 14, 2018 from the European Patent Office in counterpart EP application No. 17203601.4.

* cited by examiner

*Primary Examiner* — Tan N Tran
(74) *Attorney, Agent, or Firm* — Morgan, Lewis & Bockius LLP

(57) ABSTRACT

A flexible display device includes a first substrate defining a display region having a pixel array therein and a non-display region outside of the display region; a second substrate on the first substrate to cover the pixel array; at least one circuit attached to one side of the first substrate with a protruded portion protruding outwardly from an edge of the first substrate; and a first protective film below the first substrate and overlapping at least part of the protruded portion of the circuit.

12 Claims, 16 Drawing Sheets

(a)

(b)

(a)

(b)

(c)

FLEXIBLE DISPLAY DEVICE

This application claims the priority benefit of Korean Patent Application No. 10-2016-0161552 filed on Nov. 30, 2016, which is incorporated herein by reference for all purposes as if fully set forth herein.

BACKGROUND

Technical Field

The present invention relates to a display device, and more particularly, to a flexible display device.

Discussion of the Related Art

With the development of information technologies, there are growing demands for display devices as a medium for connecting a user to information. Accordingly, display devices such as an organic light emitting display device, a liquid crystal display (LCD) and a plasma display panel (PDP) are widely used.

Among these display devices, the organic light emitting display device is a self-emitting element. As such, it may consume less power than an LCD, which requires a backlight. Further, the organic light emitting display device may be made thinner than the LCD. In addition, the organic light emitting display device has the advantages of a wide viewing angle and a fast response speed. Technologies of manufacturing an organic light emitting display have improved so that large screens can be mass produced. Now, the market for organic light emitting displays is growing to be comparable with the market for LCDs.

Pixels in an organic light emitting display device include a self-emitting organic light emitting diode (OLED). Organic light emitting display devices may be divided by a type of emission material, an emission type, an emission structure, or a driving method. Organic light emitting display devices may be divided by an emission type into florescent emission and phosphorescent emission, or may be divided by an emission structure into a top-emission structure and a bottom-emission structure. In addition, organic light emitting display devices may be divided by a driving method into a passive matrix OLED (PMOLED) and an active matrix OLED (AMOLED).

As flexible display devices have become commonly used, various types of display devices are being developed. The flexible display devices may be implemented as various types, such as a bendable display device, a foldable display device, rollable display device, and a curved display device. Such flexible display devices may be applied not just to mobile devices, such as smart phones and table PCs, but also to TVs, automobile displays, and wearable devices. As a result, the flexible display devices can be applied in more and more fields.

SUMMARY

Accordingly, embodiments of the present disclosure are directed to a flexible display device that substantially obviates one or more of the problems due to limitations and disadvantages of the related art.

An aspect of the present disclosure is to provide a flexible display device in which a protective film is formed to secure product stability and reliability.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flexible display device comprises a first substrate defining a display region having a pixel array therein and a non-display region outside of the display region; a second substrate on the first substrate to cover the pixel array; at least one circuit attached to one side of the first substrate with a protruded portion protruding outwardly from an edge of the first substrate; and a first protective film below the first substrate and overlapping at least part of the protruded portion of the circuit.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In the descriptions of various embodiments, the same element may be described in a preceding embodiment and may not be described in a following embodiment.

It will be understood that, although the terms "first," "second," etc. may be used herein to describe various elements, these elements should not be limited by these terms. These terms are only used to distinguish one element from another. For example, a first element could be termed a second element, and similarly, a second element could be termed a first element, without departing from the scope of the present invention. Unless otherwise indicated, the singular forms include the plural forms.

A flexible display device may be implemented as liquid crystal display (LCD), field emission display (FED), plasma display panel (PDP), an organic light emitting display (OLED Display), an electrophoresis (EPD), and the like. In the following description, for convenience of explanation, a display device is described as including an organic light emitting diode (OLED).

A flexible display device includes an emission layer having an organic compound, and the emission layer is disposed between a first electrode, e.g., an anode electrode, and a second electrode, e.g., a cathode electrode. Accordingly, a hole supplied from the first electrode is combined in the emission layer with an electron supplied from the second electrode, thereby forming an exciton which is an electron-hole pair. The flexible display device is a self-emitting display device which emits light by energy which is generated when the exciton returns to the ground state.

Figure 1:
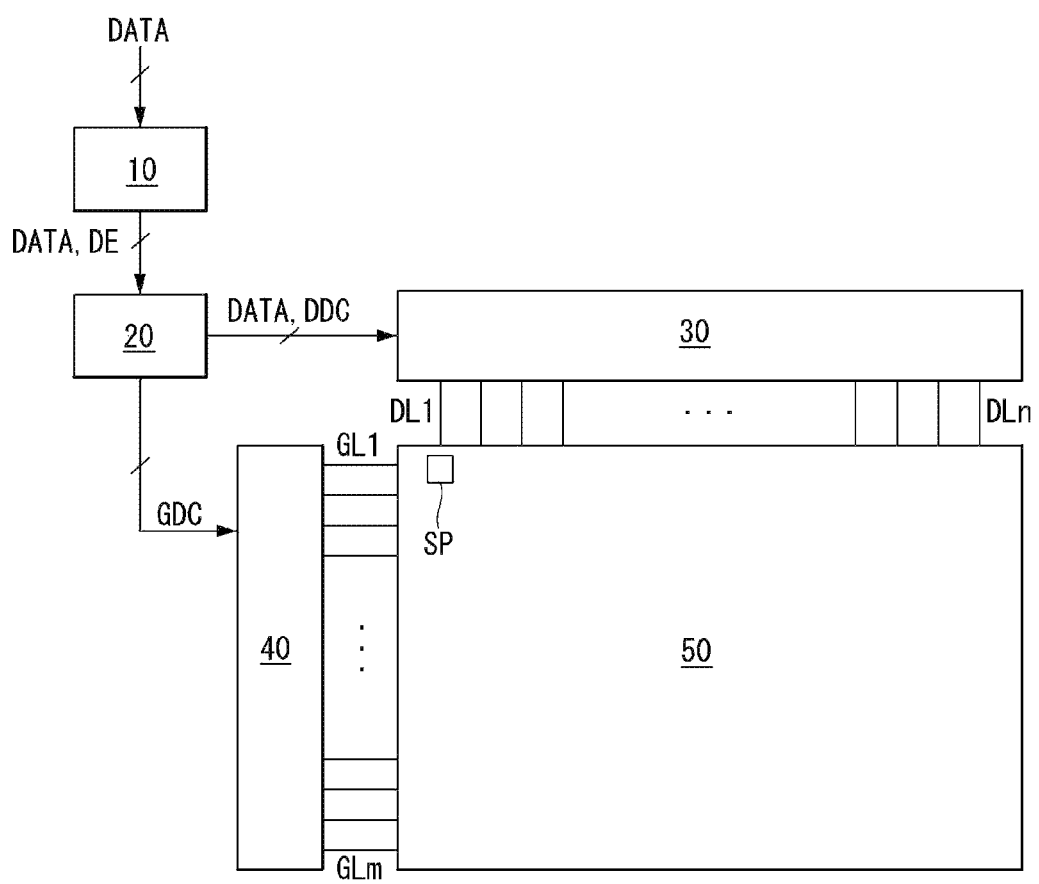
FIG. 1 is a block diagram illustrating a flexible display device.
Figure 2:
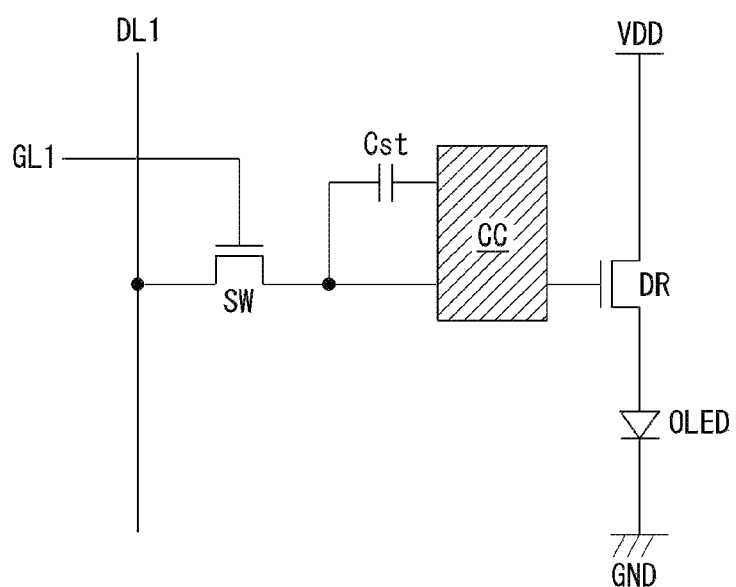
FIG. 2 is a diagram illustrating a first example embodiment of a circuit of a sub-pixel.
Figure 3:
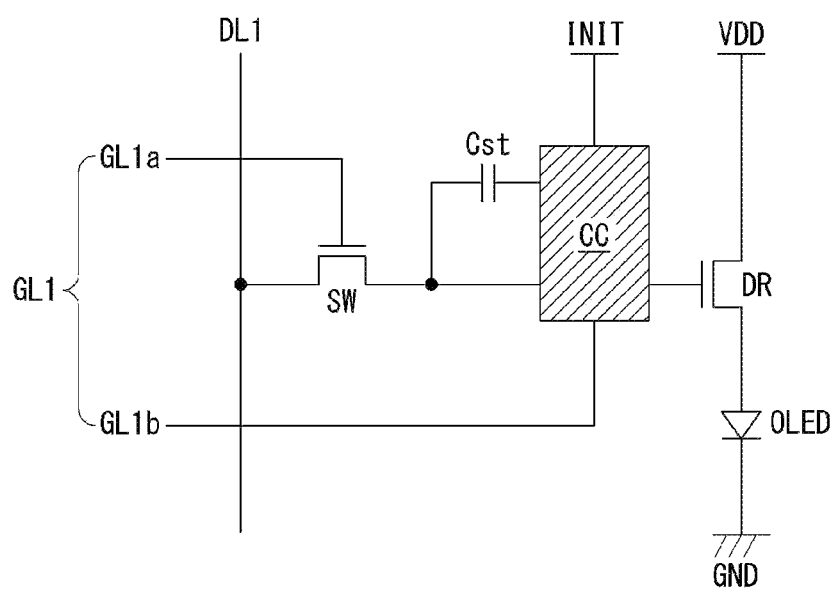
FIG. 3 is a diagram illustrating a second example embodiment of a circuit of a sub-pixel.
Figure 4:
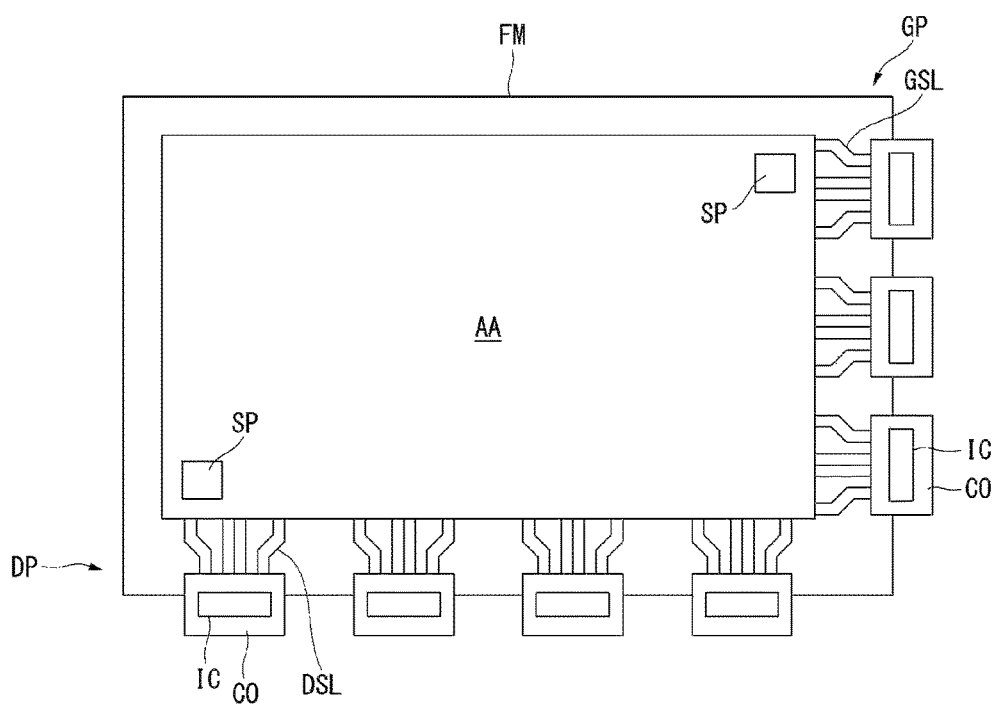
FIG. 4 is a plane view of an example of a flexible display device.
Figure 5:
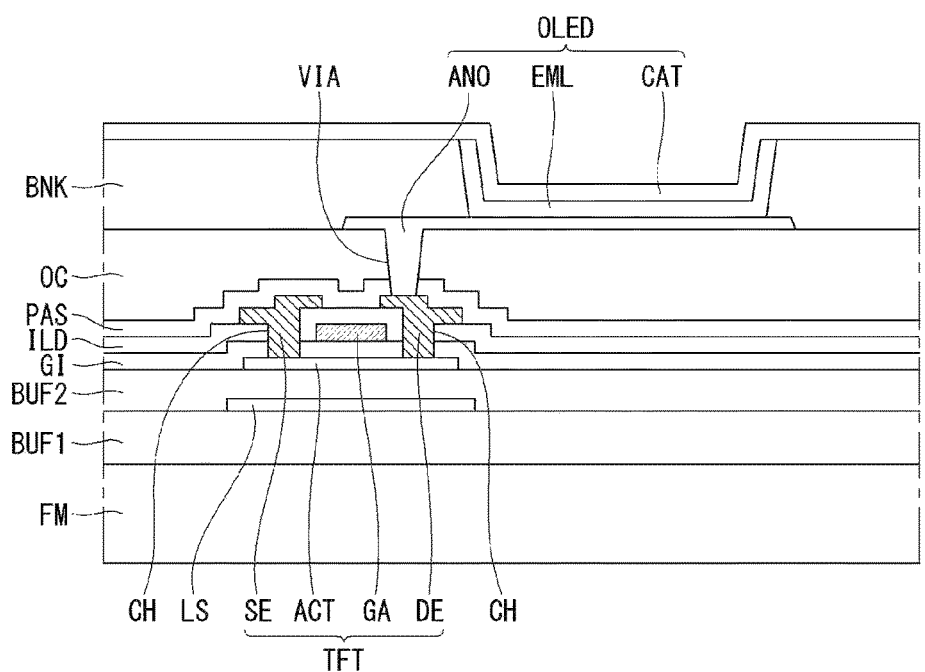
FIG. 5 is a cross-sectional view of a configuration of a sub-pixel.

FIG. 1 is a block diagram illustrating a flexible display device. FIG. 2 is a diagram illustrating a first example embodiment of a circuit of a sub-pixel. FIG. 3 is a diagram illustrating a second example embodiment of a circuit of a sub-pixel. FIG. 4 is a plane view of an example of a flexible display device. FIG. 5 is a cross-sectional view of a configuration of a sub-pixel. With reference to FIG. 1, a flexible display device may include an image processor 10, a timing controller 20, a data driver 30, a gate driver 40, and a display panel 50.

The image processor 10 outputs a data enable signal DE along with a data signal DATA supplied from the outside. Apart from the data enable signal DE, the image processor 10 may output at least one of a vertical synchronization signal, a horizontal synchronization signal, and a clock signal, but these signals are not depicted for convenience of explanation. The image processor 10 may be in the form of an integrated circuit (IC) on a system circuit board.

The timing controller 20 is supplied from the image processor 10 with a data signal DATA in addition to a data enable signal DE or a driving signal which includes a vertical synchronization signal, a horizontal synchronization signal, and a clock signal. Based on a driving signal, the timing controller 20 outputs a gate timing control signal GDC for controlling operation timing of the gate driver 40, and a data timing control signal DDC for controlling operation timing of the data driver 30. The timing controller 20 is in the form of an IC on a control circuit board.

In response to a data timing control signal DDC supplied from the timing controller 20, the data driver 30 samples and latches a data signal supplied from the timing controller 20, converts the sampled and latched data signal DATA into a gamma reference voltage, and outputs the gamma reference voltage. The data driver 30 outputs a data signal DATA via data lines DL1 to DLn. The data driver 30 is in the form of an IC adhered to a board.

In response to a gate timing control signal GDC supplied from the timing controller 20, the gate driver 40 outputs a gate signal while shifting the level of a gate voltage. The gate driver 40 outputs a gate signal via gate lines GL1 to GLm. The gate driver 40 is in the form of an IC on a gate circuit board or in the form of a gate-in-panel (GIP) circuit on the display panel 50.

The display panel 50 displays an image in response to a data signal DATA from the data driver 30 and a gate signal from the gate driver 40. The display panel 50 includes sub-pixels SP for displaying an image.

With reference to FIG. 2, a sub-pixel includes a switching transistor SW, a driving transistor DR, a compensation circuit CC, and an OLED. The OLED operates to emit light by a driving current which is formed by the driving transistor DR.

In response to a gate signal supplied via a first gate line GL1, the switching transistor SW performs a switching operation such that a data signal supplied via a first data line DL1 is stored in a capacitor as a data voltage. By the data voltage stored in the capacitor, the driving transistor DR operates to allow a driving current to flow between a high-potential power line VDD and a low-potential power line GND. The compensation circuit CC is a circuit for compensating for a threshold voltage of the driving transistor DR. In addition, a capacitor connected to the switching transistor SW or the driving transistor DR may be located within the compensation circuit CC.

The compensation circuit includes one or more thin film transistors (TFTs) and a capacitor. Configuration of the compensation circuit CC may vary depending on a compensation method, and thus, examples and descriptions thereof are herein omitted.

In addition, when the compensation circuit CC is included, as shown in FIG. 3, a sub-pixel further includes a signal line and a power line to drive a compensation TFT and supply a specific signal or power. The added signal line may be defined as a 1-2 gate line-b GL1b for driving a compensation TFT included in the sub-pixel. In FIG. 3, "GL1a" is a 1-1 gate line for driving the switching transistor SW. Further, the added power line may be defined as an initialization power line INIT for initializing a specific node of the sub-pixel to a specific voltage. However, this is merely exemplary, and aspects of the present embodiments are not limited thereto.

Meanwhile, FIGS. 2 and 3 show an example in which one sub-pixel includes a compensation circuit CC. However, if a subject of compensation is located outside of a sub-pixel, such as the data driver 30, the compensation circuit CC may be omitted. That is, one sub-pixel is basically in a 2T1C (2 TFTs and 1 capacitor) structure which includes a switching transistor SW, a driving transistor DR, a capacitor, and an OLED. If including a compensation circuit CC, a sub-pixel may have various configurations, such as 3T1C, 4T2C, 5T2C, 6T2C, and 7T2C.

In addition, FIGS. 2 and 3 show an example in which a compensation circuit CC is disposed between a switching transistor SW and a driving transistor DR. However, the compensation circuit CC may be further disposed between a driving transistor DR and an OLED. The position and structure of the compensation circuit CC are not limited to FIGS. 2 and 3.

With reference to FIG. 4, a flexible display device includes a substrate FM and a circuit unit CO. The substrate FM includes a display region AA, and a pad portion GP and DP, which are defined outside of the display region AA. In the display region AA, a plurality of sub-pixels is arranged.

The pad portion GP and DP includes a gate pad portion GP and a data pad portion DR The gate pad portion GP may be disposed in the one side of the display region AA, for example, the right or left side. The gate pad portion GP includes a plurality of gate pads. A gate pad is electrically connected to a gate signal line GSL which extends from the display region AA.

The data pad portion GP may be disposed in one side of the display region AA, for example, the bottom or top side. The data pad portion DP includes a plurality of data pads. A data pad is electrically connected to a data signal line DSL which extends from the display region AA.

The circuit unit CO includes bumps (or terminals). The bumps of the circuit unit CO are respectively adhered to pads in a pad portion via an anisotropic conductive film. The circuit unit CO may be a chip-on-film (COF), which may be a driving IC mounted on a flexible film. In another example, the circuit unit CO may be in the form of a chip-on-glass (COG) in which the circuit unit CO is attached directly to the pads on a board. In another example, the circuit unit CO may be a flexible circuit such as a flexible flat cable (FFC) and a flexible printed circuit (FPC). In the following embodiments, a COF is mainly described as an example of a circuit unit CO, but aspects of the present embodiments are not limited thereto.

A gate signal line GSL supplies a gate signal, which is applied via a circuit unit CO adhered to the gate pad portion GP, to gate lines in the display region AA. A data signal line DSL supplies a data signal, which is applied via a circuit unit CO adhered to the data pad portion DP, to a data line in the display region AA.

With reference to FIG. 5, a flexible display device includes a first buffer layer BUF1 on the substrate FM. The substrate FM may have a flexible characteristic. The first buffer layer BUF1 protects a TFT, which is formed in a post process, from impurities, such as alkali ion impurities, leaking from the substrate FM. The first buffer layer BUF1 may be a silicon oxide (SiOx) layer, a silicon nitride (SiNx) layer, or SiOx/SiNx multilayers.

A shield layer LS is disposed on the first buffer layer BUF1. The shield layer LS prevents a reduction of a panel driving current, which could occur due to the usage of a polyimide substrate. A second buffer layer BUF2 is disposed on the shield layer LS. The second buffer layer BUF2 protects a TFT, which is formed in a post process, from impurities, such as alkali ion impurities, leaking from the shield layer LS. The second buffer layer BUF2 may be a SiOx layer, an SiNx layer, or SiOx/SiNx multilayers.

A semiconductor layer ACT is disposed on the second buffer layer BUF2. The semiconductor layer ACT includes a drain region and a source region, each region including p-type or n-type impurities, and includes a channel between the drain region and a source region.

A gate insulation layer GI is disposed on the semiconductor layer ACT. The gate insulation layer GI may be an SiOx layer, an SiNx layer, or SiOx/SiNx multilayers. A gate electrode GA is disposed at a position corresponding to a specific region of the semiconductor layer ACT on the gate insulation layer GI, that is, a position corresponding to where a channel is disposed when impurities are injected. The gate electrode GA is formed of any one selected from a group of Mo, Al, Cr, Au, Ti, Ni, Nd, and Cu, or may be an alloy thereof. In addition, the gate electrode GA may be multilayers composed of any one selected from a group of Mo, Al, Cr, Au, Ti, Ni, Nd, and Cu, or may be multilayers composed of an alloy thereof. For example, the gate electrode Ga may be a double layer of Mo/Al—Nd or Mo/Al.

On the gate electrode GA, an interlayer IKD is disposed to insulate the gate electrode GA. The interlayer ILD may be an SiOx layer, an SiNx layer, or SiOx/SiNx multilayers. In some regions of the interlayer IKD and the gate insulation layer GI, the contact holes CH are disposed which expose part of the semiconductor layer ACT.

On the interlayer ILD, a drain electrode DE and a source electrode SE are disposed. The drain electrode DE is connected to the semiconductor layer ACT via which a contact hole CH which exposes a drain region of the semiconductor layer ACT, and the source electrode SE is connected to the semiconductor layer ACT via a contact hole CH which exposes a source region of the semiconductor layer ACT. The source electrode SE and the drain electrode DE may include a single layer or multiple layers. If the source electrode SE and the drain electrode DE are formed as a single layer, they may include any one selected from a group of Mo, Al, Cr, Au, Ti, Ni, Nd, and Cu, or may be an alloy thereof. If the source electrode SE and the drain electrode DE are formed as multiple layers, they may be a double layer of Mo/Al—Nd or a triple layer of Ti/Al/Ti, Mo/Al/Mo, or Mo/Al—Nd/Mo.

A passivation film PAS is disposed on the substrate FM including a TFT. The passivation film PAS is an insulation film for protecting an electrode disposed therebelow, and the passive film PAS may be an SiOx layer, an SiNx layer, or SiOx/SiNx multilayers. An overcoat layer OC is disposed on the passivation film PAS. The overcoat layer OC may be a planarization film and may be composed of an organic compound, such as polyimide, benzocyclobutene series resin, and acrylate. The overcoat layer OC may be formed in a spin-on-glass (SOG) process in which the above organic compound is coated in the form of liquid and then hardened.

In some regions of the overcoat layer OC, a via-hole VIA is disposed which exposes the drain electrode DE. An OLED is disposed on the overcoat layer OC. More specifically, a first electrode ANO is disposed on the overcoat layer OC. The first electrode ANO acts as a pixel electrode and is connected to a drain electrode of the TFT via the via-hole VIA. The first electrode ANO may be composed of a transparent conductive material, such as indium tin oxide (ITO), indium zinc oxide (IZO), and zinc oxide (ZnO). If the first electrode ANO is a reflective electrode, the first electrode ANO further includes a reflective layer. The reflective layer may include of Al, Cu, Ag, and Ni, or an alloy thereof. For example, the reflective layer may be composed of APC (Ag—Pd—Cu alloy).

On the substrate FM including the first electrode ANO, a bank layer BNK is disposed to partition pixels. The bank layer BNK may include an organic compound, such as polyimide, benzocyclobutene series resin, and acrylate. The bank layer BNK exposes part of the first electrode ANO. An emission layer EML is disposed on the exposed first electrode ANO.

A second electrode CAT is disposed on the emission layer EML. The second electrode CAT is a cathode electrode and may be composed of a low work-function material, such as Mg, Ca, Al, AG, or an alloy thereof. If the second electrode CAT is a transparent electrode, the second electrode is formed thin enough to allow light to pass therethrough. If the second electrode CAT is a reflective electrode, the second electrode CAT is formed thick enough to allow light to be reflected therefrom.

First Embodiment

Figure 6:
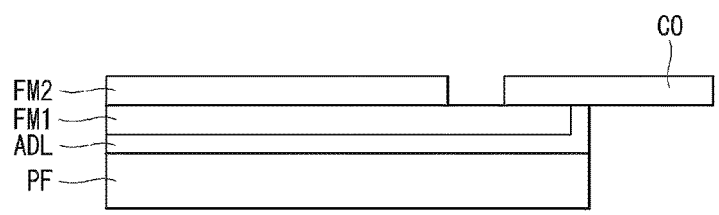
FIG. 6 is a cross-sectional view of a flexible display device according to a first example embodiment of the present invention.
Figure 7:
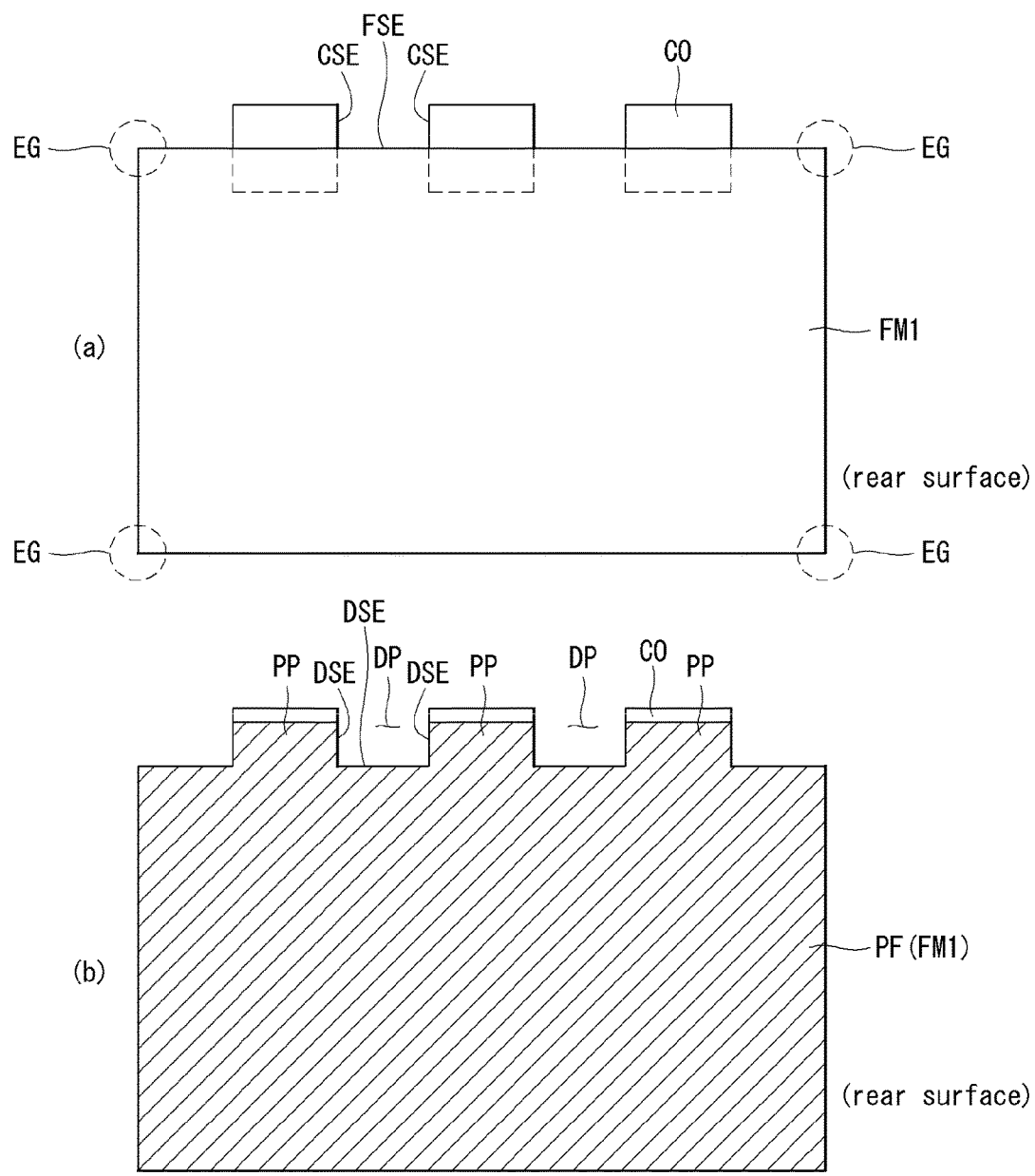
FIG. 7 is a plane view illustrating the shape of a protective film according to the first example embodiment of the present invention.
Figure 8:
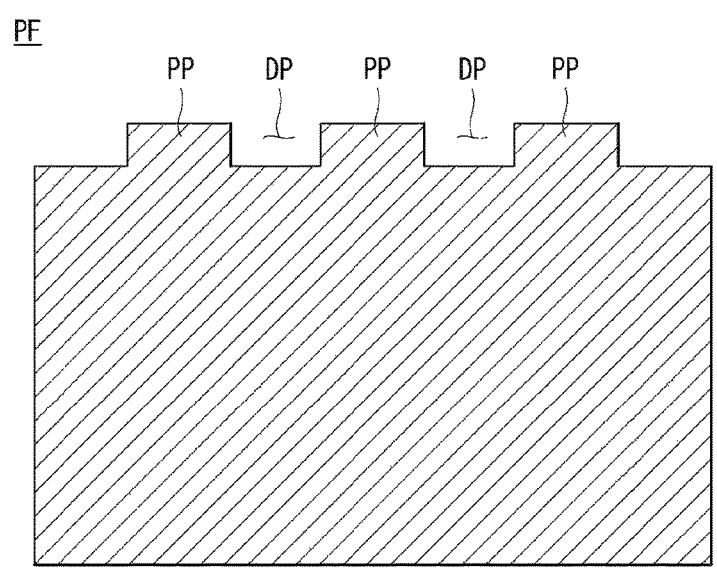
FIG. 8 is a plane view showing a location relationship between a first film, a circuit unit, and a protective film according to the first example embodiment of the present invention.

Hereinafter, a flexible display device according to a first example embodiment of the present invention will be described with reference to FIGS. 6 to 8. FIG. 6 is a cross-sectional view of a flexible display device according to the first example embodiment of the present invention. FIG. 7 is a plane view illustrating the shape of a protective film according to the first example embodiment of the present invention. FIG. 8 is a plane view showing a location relationship between a first film, a circuit unit, and a protective film according to the first example embodiment of the present invention.

With reference to FIG. 6, the flexible display device according to the first example embodiment of the present invention includes a first substrate FM1, a second substrate FM2, a circuit unit CO, and a protective film PF.

The first substrate FM1 may be formed of a flexible material which is able to bend. For example, the first substrate FM1 may be formed of polyimide (PI), polyethylene terephthalate (PET), polyethylene naphthalate (PEN), polycarbonate (PC), polyethersulfone (PES), polyarylate (PAR), polysulfone (PSF), ciclic-olefin copolymer (COC), or the like.

The first substrate FM1 includes a pixel array. The pixel array includes a display region AA (see FIG. 4) having a plurality of sub-pixels SP. The sub-pixels SP are arranged in the order of R (red), G (green), and B (blue) or in the order of R, G, B, W (white) in the display region AA so as to realize full colors. The sub-pixels SP may be partitioned by gate lines and data lines intersecting each other. The circuit unit CO is adhered to one side of the first substrate FM1.

The pixel array includes a transistor layer and a display element layer. On the transistor layer, transistors are arranged which are for driving an OLED. A transistor may be implemented as a transistor including a silicon semiconductor or as a transistor including an oxide semiconductor. The silicon semiconductor may include amorphous silicon or crystalized polysilicon. In addition, the transistors may be in various structures, such as a bottom-gate structure, a top-gate structure, and a double-gate structure.

The display element layer is provided above the transistor layer. On the display element layer, OLEDs are disposed which are driven by the transistors. An OLED includes an anode electrode, a cathode electrode, and an organic compound layer between the anode electrode and the cathode electrode. The organic compound layer includes an emission layer EML, and, if necessary or desired, may further include at least one common layer. That is, the organic compound layer may include any one selected from among a hole injection layer (HIL), a hole transport layer (HTL), an electron transport layer (ETL), and an electron injection layer (EIL).

The second substrate FM2 is disposed above the pixel array. The second substrate FM2 is provided above the second substrate FM2 to cover the pixel array so that moisture or oxygen coming inside the pixel array may be prevented. The second substrate FM2 may have a smaller size than the first substrate FM1.

The second substrate FM2 functions as an encapsulation substrate. The second substrate FM2 may be formed of a metal material. For example, the second substrate FM2 may be formed of invar having a low thermal expansion coefficient, which is an Fe—Ni alloy, but aspects of the present embodiments are not limited thereto. In another example, the second substrate FM2 may be composed of at least one organic film and at least one inorganic film, and in the structure in which organic films and inorganic films are deposited alternatively.

The flexible display device according to the first example embodiment of the present invention includes the second substrate FM2, and is thereby able to block moisture and oxygen. Accordingly, a flexible display can be provided with improved product reliability and stability.

The protective film PF is disposed below the first substrate FM1 to support the first substrate FM1. The protective film PF may reinforce rigidity of the first substrate FM1, and block moisture and oxygen which possibly come inside from below the first substrate FM1. The protective film PF may be formed of polyethylene terephthalate (PET), polyethylene naphthalate (PEN), or polycarbonate (PC), but aspects of the present embodiments are not limited thereto.

The protective film PF is arranged extending to overlap at least part of the bottom of the circuit unit CO. One side of the circuit unit CO is adhered to the first substrate FM1, and the other side of the circuit unit CO extends from the end of the first substrate FM1 to protrude outward. The protective film PF is positioned to correspond to at least part of the extension portion of the circuit unit CO, and the extension portion protrudes outwardly from the first substrate FM1.

The protective film PF is disposed below the circuit unit CO to support the circuit unit CO. The protective film PF may reinforce not just rigidity of the first substrate FM1, but rigidity of the circuit unit CO, and may block moisture and oxygen that may come inside the circuit unit CO from below the circuit unit CO.

The flexible display device has a specific flexibility by which rolling, folding, and unrolling/unfolding of the flexible display device can be performed easily and repeatedly. Change in a state of the flexible display device may be caused by a physical external force applied directly from a user. For example, the user may change a state of the flexible display device by gripping one end of the flexible display device and applying force thereto. Change in a state of the flexible display device may be controlled by a controller in response to a predetermined specific signal. That is, change in a state of the flexible display device may be controlled by a selected driving device or driving circuit.

If a state of the flexible display device is repeatedly changed, strong stress is provided to a portion where the first substrate FM1 and the circuit unit CO are attached thereto. In addition, even during a process, the strong stress may keep being applied to the portion where the first substrate FM1 and the circuit unit CO are attached thereto. Due to the strong stress, the circuit unit CO may fail to remain adhered to the first substrate FM1 and therefore may be separated (peel off) from the first substrate FM1 and cause an error which is crack occurring in pads and bumps.

With the first substrate FM1 and the protective film PF below the circuit unit CO, the flexible display device according to the first embodiment of the present invention may minimize a possibility that the circuit unit CO is separated or crack occurs in pads and bumps when a state of the flexible display device is changed. Accordingly, the first embodiment of the present invention improves product stability and reliability.

The protective film PF may be adhered the first substrate FM1 and at least part of the circuit unit CO via an adhesion layer ADL. The adhesion layer ADL is formed to have a predetermined thickness to absorb an external shock. In addition, the adhesion layer ADL is formed to have a predetermined thickness to secure a long inflow path of moisture and oxygen. Accordingly, the first example embodiment of the present invention may provide a flexible display device with improved product stability and reliability.

With reference to FIGS. 7 and 8, the protective film PF is formed to cover an edge (or corner) EG of the first substrate FM1. Specifically, the edge of the first substrate FM1 is susceptible to an external shock. That is, the edge EG of the first substrate FM1 is easily affected by intervention of a different device when a state of the flexible display device is changed or during a manufacturing process. For this reason, the edge EG of the first substrate FM1 may be easily damaged. In addition, due to flexibility, the protective film PF may be easily rolled up or folded during a process or transfer, and this may make it difficult to perform the process.

With the protective film PF formed to cover the edge of the first substrate FM1, the first example embodiment of the present invention may fully protect the edge EG of the first substrate from the bottom. Accordingly, it is possible to secure product stability and reliability and to reduce errors that could occur during a process, thereby significantly increasing product yield and reducing a tact time. In addition, if the protective film PF covers the edge of the first substrate, it is possible to achieve a neat appearance.

In addition, one side of the protective film PF may be in the form of a concave-convex plane. One side of the protective film PF corresponds to one side of the first substrate FM1 to which the circuit units CO are adhered. That is, the protective film PF may include concave portions and convex portions, which correspond to the position and the number of the circuit units CO. The concave portions DP and the convex portions PP are disposed alternatively. For example, suppose that three circuit units CO are adhered to one side of the first substrate FM1 while being spaced apart from each other at a predetermined distance. In this case, three convex portions PP may be formed on one side of the protective film PF while being spaced apart from each other at the predetermined distance. In the drawings, the circuit units CO are depicted as being formed only on the top side of the first substrate FM, but aspects of the present embodiments are not limited thereto. The circuit units CO may be adhered to at least one of the top, bottom, left, and right sides of the first substrate FM1.

The convex portions PP are disposed below corresponding circuit units CO. That is, a convex portion PP is disposed to correspond to at least part of an extension portion of a circuit unit CO, the extension portion which protrudes outwardly from the first substrate FM1. Thus, the circuit units CO may be supported by the convex portions PP of the protective film PF. Accordingly, the first example embodiment of the present invention may provide a flexible display device with improved durability.

When one side of the protective film PF is not in the form of a concave-convex plane but in the form of a level plane, the protective film PF may extend to cover at least part of a circuit unit extending outwardly from the first substrate FM1. Thus, an adhesion layer ADL between the protective film PF and the first substrate FM1 may be exposed between neighboring circuit units CO. In this case, foreign substances may be adhered to the exposed adhesion layer ADL, thereby causing an unnecessary problem or intervention with a different device. To prevent these problems, one side of the protective film PF may be in the form of a concave-convex plane while side ends DSE of the concave portions DP do not protrude outwardly from side ends FSE of the first substrate FM1 and side ends CSE of the circuit units CO. A side end DSE of a concave portion DP indicates the boundary that defines the shape of the concave portion DP. A side end of the first substrate FM1 indicates the boundary that defines the shape of the first substrate FM1. A side end CSE of a circuit unit CO indicates the boundary that defines the shape of the circuit unit CO.

Second Embodiment

Figure 9:
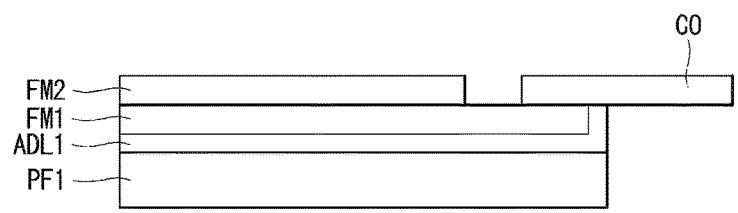
FIGS. 9 and 10 are cross-sectional views of a flexible display device according to a second example embodiment of the present invention.
Figure 10:
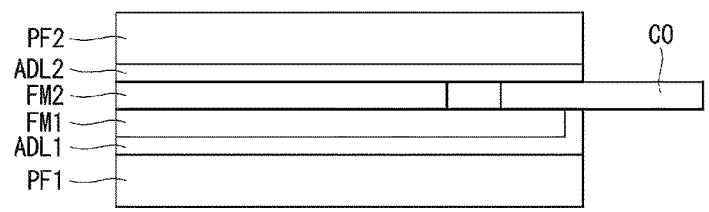
Figure 11:
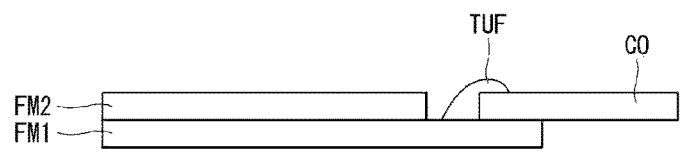
FIG. 11 is a cross-sectional view of a flexible display device according to a comparison example.
Figure 12:
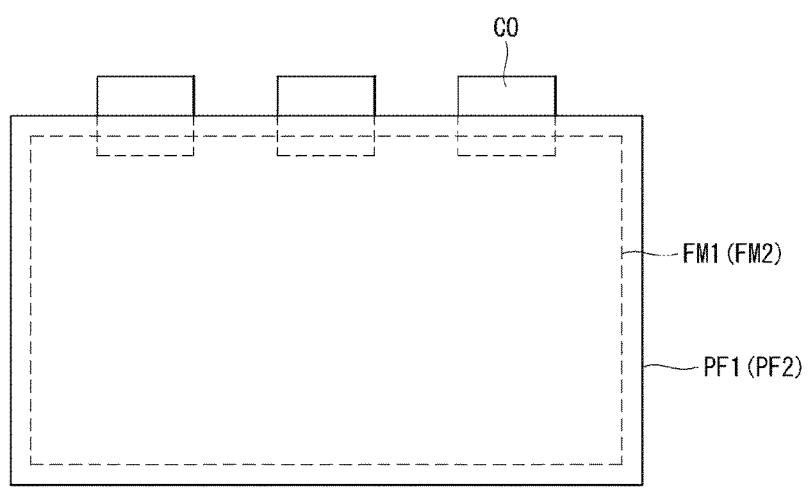
FIG. 12 is a plane view of a flexible display device according to the second example embodiment of the present invention.

Hereinafter, a flexible display device according to a second example embodiment of the present invention will be described with reference to FIGS. 9 to 12. FIGS. 9 and 10 are cross-sectional views of the flexible display device according to the second embodiment of the present invention. FIG. 11 is a cross-sectional view of a flexible display device according to a comparison example. FIG. 12 is a plane view of the flexible display device according to the second example embodiment of the present invention.

With reference to FIG. 9, the flexible display device may include a first substrate FM1, a second substrate FM2, a circuit unit CO, and a first protective film PF1. The first substrate FM1 may be formed of a flexible material which is able to bend. For example, the first substrate FM1 may be formed of polyimide (PI), polyethylene terephthalate (PET), polyethylene naphthalate (PEN), polycarbonate (PC), polyethersulfone (PES), polyarylate (PAR), polysulfone (PSF), ciclic-olefin copolymer (COC), or the like.

The first substrate FM1 includes a pixel array. The pixel array includes a display region AA (see FIG. 4) having a plurality of sub-pixels SP (see FIG. 4). The sub-pixels SP may be arranged in the order of R (red), G (green), and B (blue) or in the order of R, G, B, and W (white) in the display region AA to realize full colors. The sub-pixels SP may be partitioned by gate lines and data lines intersecting each other. The circuit unit CO is adhered to one side of the first substrate FM1.

The pixel array includes a transistor layer and a display element layer. On the transistor layer, transistors are arranged for driving an OLED. A transistor may be implemented as a transistor including a silicon semiconductor or as a transistor including an oxide semiconductor. The silicon semiconductor may include amorphous silicon or crystalized polycrystalline silicone. In addition, the transistors may be in various structures, such as a bottom-gate structure, a top-gate structure, and a double-gate structure.

The display element layer is provided above the transistor layer. On the display element layer, OLEDs are disposed which are driven by the transistors. An OLED includes an anode electrode, a cathode electrode, and an organic compound layer between the anode electrode and the cathode electrode. The organic compound layer includes an emission layer EML, and may further include at least one common layer. That is, the organic compound layer may include any one selected from among a hole injection layer (HIL), a hole transport layer (HTL), an electron transport layer (ETL), and an electron injection layer (EIL).

The second substrate FM2 is disposed above the pixel array. The second substrate FM2 may be formed of a flexible material that is able to bend. For example, the second substrate FM2 may be of polyimide (PI), polyethylene terephthalate (PET), polyethylene naphthalate (PEN), polycarbonate (PC), polyethersulfone (PES), polyarylate (PAR), polysulfone (PSF), ciclic-olefin copolymer (COC), or the like. The second substrate FM2 may be formed of the same material as that of the first substrate FM1, but aspects of the present embodiments are not limited thereto. The second substrate FM2 may have a smaller size than the first substrate FM1.

The second substrate FM2 includes a color filter array. The color filter array includes color filters arranged in the order of R, G, and B or in the order of R, G, B, and W. The color filters are aligned with the sub-pixels SP of the pixel array. For example, OLEDs provided on the display element layer may emit white light, and the white light may pass through color filters to realize a predetermined color. The color filter array may further include a black matrix to partition the color filters, but aspects of the present embodiments are not limited thereto.

The first protective film PF1 is disposed below the first substrate FM1 to support the first substrate FM1. The protective film PF may reinforce rigidity of the first substrate FM1 and block moisture and oxygen which could possibly come inside from below the first substrate FM1. The first protective film PF1 may be formed of polyethylene terephthalate (PET), polyethylene naphthalate (PEN), or polycarbonate (PC), but aspects of the present embodiments are not limited thereto.

The first protective film PF1 extends to overlap the first substrate FM1 and at least part of the circuit unit CO. One side of the circuit unit CO is adhered to the first substrate FM1, and the other side of the first substrate FM1 extends from one end of the first substrate FM1 to protrude outwardly. The first protective film PF is disposed to correspond to at least part of an extension portion of the circuit unit CO, the extension portion which protrudes outwardly from the first substrate FM1.

The first protective film PF1 is disposed below the circuit unit CO to support the circuit unit CO. The first protective film PF1 may reinforce not just rigidity of the first substrate FM1, but rigidity of the circuit unit CO, and may block moisture and oxygen that could come inside the circuit unit CO from below the circuit unit CO.

The flexible display device has a specific flexibility by which rolling, folding, and unrolling/unfolding of the flexible device can be performed easily and repeatedly. When a state of the flexible display device is repeatedly changed and/or when a process is being continued, strong stress is applied to a portion where the first substrate FM1 and the circuit unit CO are attached. Due to the stress, the circuit unit CO may fail to remain adhered to the first substrate FM1, thereby becoming separated (peel off) and, therefore, may cause an error, such as a crack occurring in pads and bumps.

With the first protective film PF1 provided below the first substrate FM1 and the circuit unit CO, the flexible display device may reduce a possibility that the circuit unit CO is separated or crack occurs in pads and bumps when a state of the flexible display device is changed. Accordingly, product stability and reliability may be improved.

The first protective film PF1 may be adhered to the first substrate FM1 and at least part of the circuit unit CO via a first adhesion layer ADL1. The first adhesion layer ADL1 may be formed to have a predetermined thickness so as to absorb an external shock. In addition, the first adhesion layer ADL1 may be formed to have a predetermined thickness so as to secure a long incoming path of moisture and oxygen. Accordingly, the second example embodiment of the present invention may provide a flexible display device with improved product stability and reliability.

With reference to FIG. 10, the flexible display device according to the second example embodiment of the present invention may further include a second protective film PF2.

The second protective film PF2 is disposed above the second substrate FM2 to support the second substrate FM2. The second protective film PF2 may reinforce rigidity of the second substrate FM2, and block moisture and oxygen which could possibly come inside from above the second substrate FM2. The second protective film PF2 may be formed of polyethylene terephthalate (PET), polyethylene naphthalate (PEN), or polycarbonate (PC), but aspects of the present embodiments are not limited thereto. The second protective film PF2 may be formed of the same material as that of the first protective film PF1, but aspects of the present embodiments are not limited thereto.

The second protective film PF2 extends to overlap at least part of the top of the circuit unit CO. The second protective film PF2 is disposed to correspond to at least part of an extension portion of the circuit unit CO, the extension portion which protrudes outwardly from the first substrate FM1. As illustrated in FIG. 10, the second protective film PF2 may have the same size as the first protective film PF1, but aspects of the present embodiments are not limited thereto.

The second protective film PF2 is disposed above the circuit unit CO to support the circuit unit CO. The second protective film PF2 may reinforce not just rigidity of the second substrate FM2, but rigidity of the circuit unit CO, and block moisture and oxygen which could come inside the circuit unit CO from below the circuit unit CO.

The second protective film PF2 may be adhered to the second substrate FM2 and at least part of the circuit unit CO via a second adhesion layer ADL2. The second adhesion layer ADL2 may be formed to have a predetermined thickness to absorb an external shock. In addition, the second adhesion layer ADL2 may be formed to have a predetermined thickness to secure a long incoming path of moisture and oxygen. Accordingly, the second example embodiment of the present invention may provide a flexible display device with improved product stability and reliability.

As described above, due to stress applied to a portion where the circuit unit CO and the first substrate FM1 are attached, the circuit unit CO may fail to remain adhered to the first substrate FM1 but become separate (torn) and may cause an error which is crack occurring in pads and bumps.

With reference to FIG. 11, to prevent the aforementioned problem, an existing display device includes a buffer member TUF, such as tuffy, in a portion where the first substrate FM1 and the circuit unit CO are connected. That is, the existing display device utilizes a buffer member TUF having a predetermined rigidity in order to make the attachment of the first substrate FM1 and the circuit unit CO strong and to protect from an external physical shock. Considering physical properties, such as rigidity, of the buffer member TFF which is for example tuffy, it is difficult to employ the buffer member TUF in a flexible display device which is repeatedly rolled up and unrolled out. In other words, the buffer member TUF, such as tuffy, restricts smoothly changing the state of a flexible display.

With the use of the second protective film PF2 extending to the top of the circuit unit CO, the flexible display device may be able to protect the second substrate FM2 and to make the circuit unit CO and the first substrate FM1 attached more strongly. Accordingly, the second embodiment of the present invention may provide a flexible display device with improved product reliability and stability. In addition, the second example embodiment of the present invention does not require an additional process to form an additional buffer member TUF, unlike the existing display device. Thus, the second example embodiment of the present invention may reduce the tact time and costs which are required for adding an additional process, and may reduce a process defect, thereby significantly improving a process yield. In addition, the second example embodiment of the present invention does not utilize tuffy, which is not transparent, and thus, has an advantage in realizing a transparent display device.

With reference to FIG. 12, the first protective film PF1 and the second protective film PF2 are formed to have a larger size than the first substrate FM1, thereby enabled to embrace the first substrate FM1 and the second substrate FM2. That is, the first protective film PF1 and the second protective film PF2 may be provided in a manner in which side ends of the first protective film FM1 and the second protective film FM2 protrude side ends of the first substrate FM1 and the second substrate FM2. The side ends of the first protective film PF1 and the second protective film PF2 indicates the boundary that defines the shape of the first protective film PF1 and the second protective film PF2. The side ends of the first substrate FM1 and the second substrate FM2 indicate the boundary that defines the shape of the first substrate FM1 and the second substrate FM2. In this case, the first protective film PF1 and the second protective film PF2 may seal the first substrate FM1 and the second substrate FM2, thereby fully protecting the pixel array and the color filter array, which are respectively provided on the first substrate FM1 and the second substrate FM2, from an outside environment.

Third Embodiment

Figure 13:
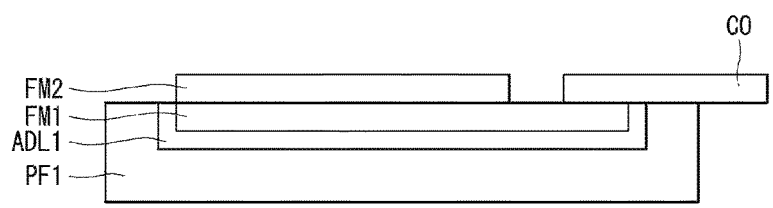
FIGS. 13 and 14 are cross-sectional views of a flexible display device according to a third example embodiment of the present invention.
Figure 14:
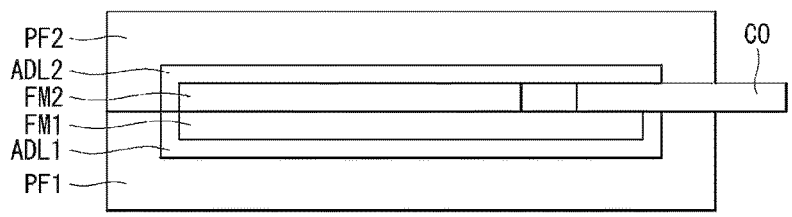

Hereinafter, a flexible display device according to a third example embodiment of the present invention will be described with reference to FIGS. 13 and 14. FIGS. 13 and 14 are cross-sectional views of the flexible display device according to the third example embodiment of the present invention.

With reference to FIG. 13, a first protective film PF1 is formed to embrace the bottom surface of a first substrate and the circumference of the side surfaces thereof. The flexible display device may block moisture and oxygen, which could come inside from the side surfaces of a first adhesion layer ADL1, and therefore, the flexible display device may improve product reliability and stability.

In FIG. 13, the first protective film PF1 is depicted as being bent along the shape of the first substrate FM1, but aspects of the present embodiments are not limited thereto. When the first substrate FM1 and a second substrate FM2 have a sufficiently thin thickness and the first protective film PF1 has a specific flexibility, the first protective film PF1 may have a curved-shape, not a bent-shape.

With reference to FIG. 14, the second protective film PF2 may be formed to embrace the top surface of the second substrate FM2 and the circumference of the side surfaces thereof. The flexible display device may block moisture and oxygen, which could come inside from the side surfaces of the first adhesion layer ADL1 and a second adhesion layer ADL2, and therefore, the flexible display device may improve product reliability and stability.

In FIG. 14, the second protective film PF2 is depicted as being bent along the shape of the second substrate FM2, but aspects of the present embodiments are not limited thereto. When the first substrate FM1 and a second substrate FM2 have a sufficiently thin thickness and the second protective film PF2 has a specific flexibility, the second protective film PF2 may have a curved-shape, not a bent-shape.

Fourth Embodiment

Figure 15:
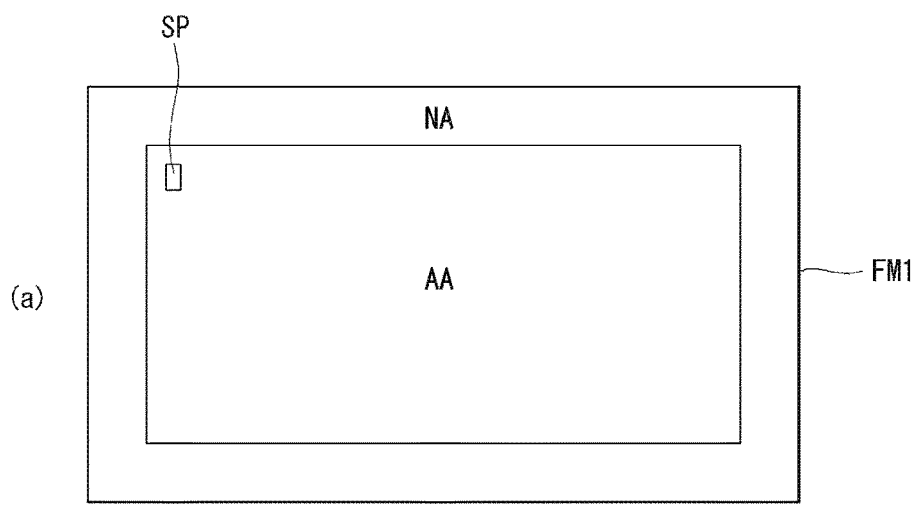
FIG. 15 is a plane view of a flexible display device according to a fourth example embodiment of the present invention.
Figure 15:
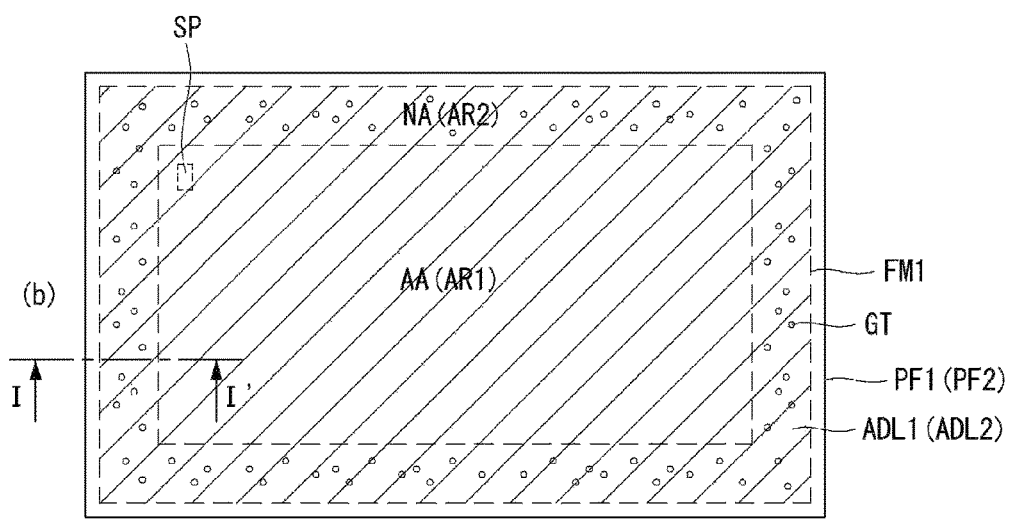
Figure 16:
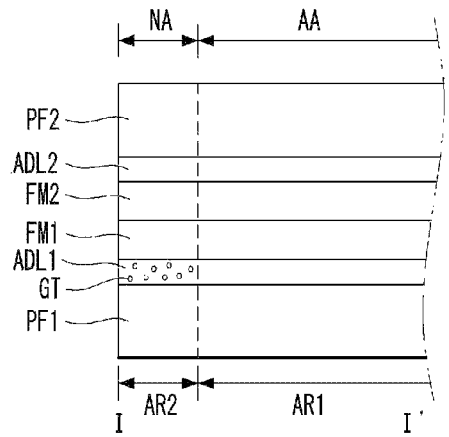
FIG. 16 is a cross-sectional view of portion (b) in FIG. 15, which is cut along line I-I'.
Figure 16:
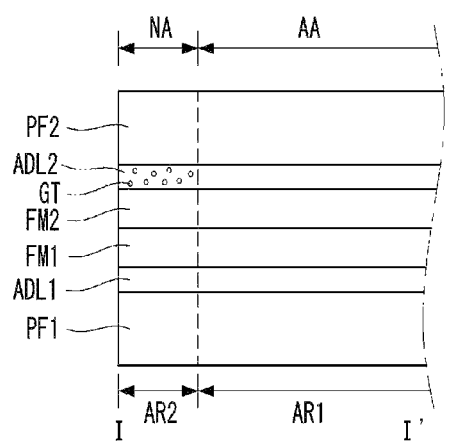
Figure 16:
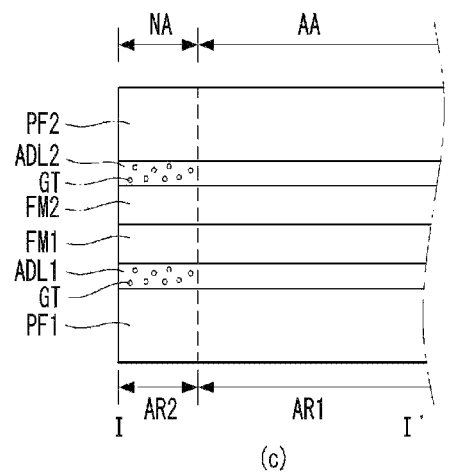

Hereinafter, a flexible display device according to a fourth example embodiment of the present invention will be described with reference to FIGS. 15 and 16. FIG. 15 is a plane view of the flexible display device according to the fourth example embodiment of the present invention. FIG. 16 is a cross-sectional view of portion (b) in FIG. 15, which is cut along line I-I'.

With reference to FIGS. 15 and 16, the flexible display device may include a first substrate FM1, a second substrate FM2, and a protective film PF1 and PF2. A pixel array included in the first substrate FM1 includes a display region AA, and a non-display region NA that is located outside of the display region. The display region AA is a region in which an input image is displayed, and a plurality of sub-pixels are arranged on the display region AA.

The protective film PF1 and PF2 includes a first protective film PF1 adhered to the bottom of the first substrate FM1, and a second protective film PF2 adhered to the top of the second substrate. The first protective film PF1 is adhered to the first substrate via a first adhesion layer ADL1 that may be provided between the first substrate FM1 and the first protective film PF1. The second protective film PF2 is adhered to the second substrate FM2 via a second adhesion layer that may be provided between the second substrate FM2 and the second protective film PF2. The first adhesion layer ADL1 and the second adhesion layer ADL2 may include a first region AR1 corresponding to the display region AA, and a second region AR2 corresponding to a non-display region NA.

The flexible display device according to the fourth example embodiment of the present invention may include a getter GT coming into a second region AR2 of the first adhesion layer ADL1. For the getter GT, at least one of an inorganic phosphate compound, a metal oxide, a metal halide compound, inorganic acid salt, an amorphous inorganic compound. The getter GT absorbs moisture and oxygen which could come inside from the outside (see portion (a) of FIG. 16).

The flexible display device according to the fourth example embodiment of the present invention may include a getter GT coming into a second region AR2 of the second adhesion layer ADL2. The getter GT may absorb moisture and oxide which possibly come inside from the outside (see portion (b) of FIG. 16).

The flexible display device may include a getter GT coming into the second region AR2 of the first adhesion layer ADL1 and the second region AR2 of the second attachment region ADL2. The getter GT may absorb moisture and oxygen that may come inside from the outside (see portion (c) of FIG. 16).

With the inclusion of the getter GT in the second region AR2 of the adhesion layer ADL1 and ADL2, the fourth example embodiment of the present invention is able to effectively block moisture and oxygen which could come inside from the outside. Accordingly, the fourth example embodiment of the present invention may prevent deterioration of an element due to moisture and oxygen, thereby securing product reliability and stability.

In the case where a getter GT is included in the first region AR1 of the adhesion layer ADL1 and ADL2, light emitted from the display region AA to display an image may scatter by the getter GT in an undesired direction. To prevent this problem, the flexible display device according to the fourth example embodiment of the present invention is implemented such that the getter is located only in the second region AR2 of the adhesion layer ADL1 and ADL2.

It will be apparent to those skilled in the art that various modifications and variations can be made in the flexible display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flexible display device, comprising:
 a first substrate defining a display region having a pixel array therein and a non-display region outside of the display region;
 a second substrate on the first substrate to cover the pixel array;
 at least one circuit attached to one side of the first substrate with a protruded portion protruding outwardly from an edge of the first substrate; and
 a first protective film below the first substrate and overlapping at least part of the protruded portion of the circuit wherein the one side of the first protective film has a planar shape including concave portions and convex portions, and the convex portions overlap at least part of the protruded portion of the circuit.

2. The flexible display device of claim 1, wherein an edge of the first protective film along the concave portion does not protrude beyond the edge of the first substrate, and the concave portion does not extend beyond a side of the circuit.

3. The flexible display device of claim 1, wherein the first protective film covers the edge of the first substrate.

4. The flexile substrate of claim 1, wherein the second substrate is an encapsulation substrate.

5. The flexible display device of claim 1, wherein the first protective film covers a bottom surface and side surfaces of the first substrate.

6. The flexible display device of claim 1, further comprising a first adhesion layer between the first substrate and the first protective film, the first adhesion layer defining a first region corresponding to the display region and a second region corresponding to the non-display region, wherein the second region of the first adhesion layer includes a getter.

7. The flexible display device of claim 1, further comprising a second protective film above the second substrate and extending to overlap at least part of the protruding portion of the circuit.

8. The flexible display device of claim 7, wherein an edge of the first protective film and edge of the second protective film protrude from the edge of the first substrate.

9. The flexible display device of claim 7, wherein the second protective film covers a top surface and side surfaces of the second substrate.

10. The flexible display device of claim 7, further comprising:
 a first adhesion layer between the first substrate and the first protective film, the first adhesion layer defining first and second regions thereof with the first region of the first adhesion layer corresponding to the display region and the second region of the first adhesion layer corresponding to the non-display region; and
 a second adhesion layer between the second substrate and the second protective film, the second adhesion layer defining first and second regions thereof with the first region of the second adhesion layer corresponding to the display region and the second region of the second adhesion layer corresponding to the non-display region,
 wherein at least one of the first region of the first adhesion layer and the second region of the second adhesion layer includes a getter.

11. The flexible display device of claim 7, wherein the second substrate is a color filter substrate having a color filter array.

12. The flexible display device of claim 1, wherein the second substrate is a color filter substrate having a color filter array.

* * * * *